US012805030B2

(12) United States Patent
Iwamoto et al.

(10) Patent No.: US 12,805,030 B2
(45) Date of Patent: Nov. 17, 2026

(54) SOLAR CELL MODULE

(71) Applicant: TOYOTA JIDOSHA KABUSHIKI KAISHA, Toyota (JP)

(72) Inventors: Shoichi Iwamoto, Fuji (JP); Ryuzo Tagami, Toyota (JP); Ryota Morikawa, Osaka (JP); Yuya Okuda, Nisshin (JP); Shinya Iwasaki, Mizuho (JP); Shintaro Hinata, Toyota (JP); Hiroki Ushio, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 19/361,391

(22) Filed: Oct. 17, 2025

(65) Prior Publication Data

US 2026/0123058 A1 Apr. 30, 2026

(30) Foreign Application Priority Data

Oct. 25, 2024 (JP) ................................ 2024-188275

(51) Int. Cl.
*H10F 19/85* (2025.01)

(52) U.S. Cl.
CPC .................................... *H10F 19/85* (2025.01)

(58) Field of Classification Search
CPC ................................. H01F 19/85; H02S 30/10
See application file for complete search history.

(56) References Cited

U.S. PATENT DOCUMENTS

2010/0255224 A1* 10/2010 Gubbels .............. E06B 3/67343 524/588
2017/0301812 A1* 10/2017 Huang .................... H02S 30/10
2020/0335640 A1* 10/2020 Millard ................. H10F 19/807

FOREIGN PATENT DOCUMENTS

JP 2012-212948 A 11/2012
WO WO2024223730 * 4/2024

* cited by examiner

*Primary Examiner* — Jayne L Mershon
(74) *Attorney, Agent, or Firm* — Oliff PLC

(57) ABSTRACT

Provided is a solar cell module capable of securing performance in terms of the rate of water vapor transmission through a module edge. The solar cell module includes: a spacer disposed between edges of front and back surface plates so as to surround a solar cell unit sealed with sealing material and securing a space where the solar cell unit is disposed, in the thickness direction of the solar cell unit; butyl rubber sealing a gap between the edge of front surface plate and the spacer and butyl rubber sealing a gap between the edge of back surface plate and the spacer; and foam rubber disposed between the front and back surface plates so as to be interposed (positioned on the inner side of the spacer) between the spacer and sealing material, the foam rubber capable of relaxing or absorbing a pressing force of the sealing material against the spacer.

5 Claims, 4 Drawing Sheets

SOLAR CELL MODULE

CROSS REFERENCE TO RELATED APPLICATIONS

The present application claims priority from Japanese patent application JP 2024-188275 filed on Oct. 25, 2024, the entire content of which is hereby incorporated by reference into this application.

BACKGROUND

Technical Field

The present disclosure relates to a solar cell module.

Background Art

JP 2012-212948 A discloses a solar cell module provided, at its module edge portion, with a spacer made of glass, resin, or metal. This solar cell module includes a solar cell array including a plurality of solar cells that is electrically connected to one another, a first plate-shaped member positioned on a non-light-receiving surface side of the solar cell array, a translucent second plate-shaped member positioned on a light-receiving surface side of the solar cell array, a frame-shaped spacer member that is positioned between the first plate-shaped member and the second plate-shaped member so as to surround the solar cell array and that secures a space where the solar cell array is disposed in the thickness direction of the solar cell array, and a translucent resin sealing layer that is positioned between the first plate-shaped member and the second plate-shaped member and that seals the solar cell array therein as well as closely adheres to the first plate-shaped member, the second plate-shaped member, and the frame-shaped spacer member. It is stated that because of the above, water ingress through a module edge portion, as well as generation of cracks and chips of the solar cells in the manufacturing process, can be prevented.

SUMMARY

However, such an arrangement with a spacer made of glass, resin, or metal provided at a module edge portion as in the aforementioned conventional technique cannot secure the performance in terms of the rate of water vapor transmission through a module edge portion. For example, when butyl rubber is used as the spacer, if the butyl rubber is thick, the performance in terms of water the vapor transmission rate cannot be secured.

For example, in a case of a perovskite solar cell module with a laminated glass structure, in order to secure the performance in terms of the water vapor transmission rate by thinning butyl rubber as a countermeasure against water entering through the module edge portion, a structure using a metal spacer and butyl rubber is conceived. However, such a structure is still incapable of securing the performance in terms of the water vapor transmission rate, since a sealing material inside pushes the metal spacer and butyl rubber outward during manufacturing. That is, a mere combination of the spacer (made of glass, resin, or metal) and butyl rubber cannot improve the performance in terms of the water vapor transmission rate.

The present disclosure has been made in view of the foregoing, and provides a solar cell module capable of securing the performance in terms of the rate of water vapor transmission through a module edge portion.

In order to solve the foregoing, the solar cell module according to the present disclosure includes: a solar cell unit including at least one solar cell; a solar cell sealing material that seals the solar cell unit; a front surface plate disposed on a light-receiving surface side of the solar cell unit in the solar cell sealing material; a back surface plate disposed on an opposite side of the light-receiving surface side in the solar cell sealing material; a spacer disposed between an edge portion of the front surface plate and an edge portion of the back surface plate so as to surround the solar cell unit sealed with the solar cell sealing material, the spacer securing a space where the solar cell unit is disposed in a thickness direction of the solar cell unit; a front surface plate side sealing material that seals a gap between the edge portion of the front surface plate and the spacer and a back surface plate side sealing material that seals a gap between the edge portion of the back surface plate and the spacer; and foam rubber disposed between the front surface plate and the back surface plate so as to be interposed between the spacer and the solar cell sealing material, the foam rubber being capable of relaxing or absorbing a pressing force of the solar cell sealing material against the spacer.

According to the present disclosure, for example, with a spacer having recesses for accommodating a sealing material, the position and thickness of the sealing material can be strictly controlled, and with foam rubber provided on an inner side of the spacer, an excess sealing material can be absorbed so as to control the thickness of the sealing material, thereby enabling to secure the performance in terms of the rate of water vapor transmission through a module edge portion.

DETAILED DESCRIPTION

Hereinafter, an embodiment of the present disclosure will be described in detail with reference to the drawings from FIG. 1 to FIG. 4. Note that the embodiment shown below is one aspect of the present disclosure and does not limit the technical scope of the present disclosure.

Figure 1:
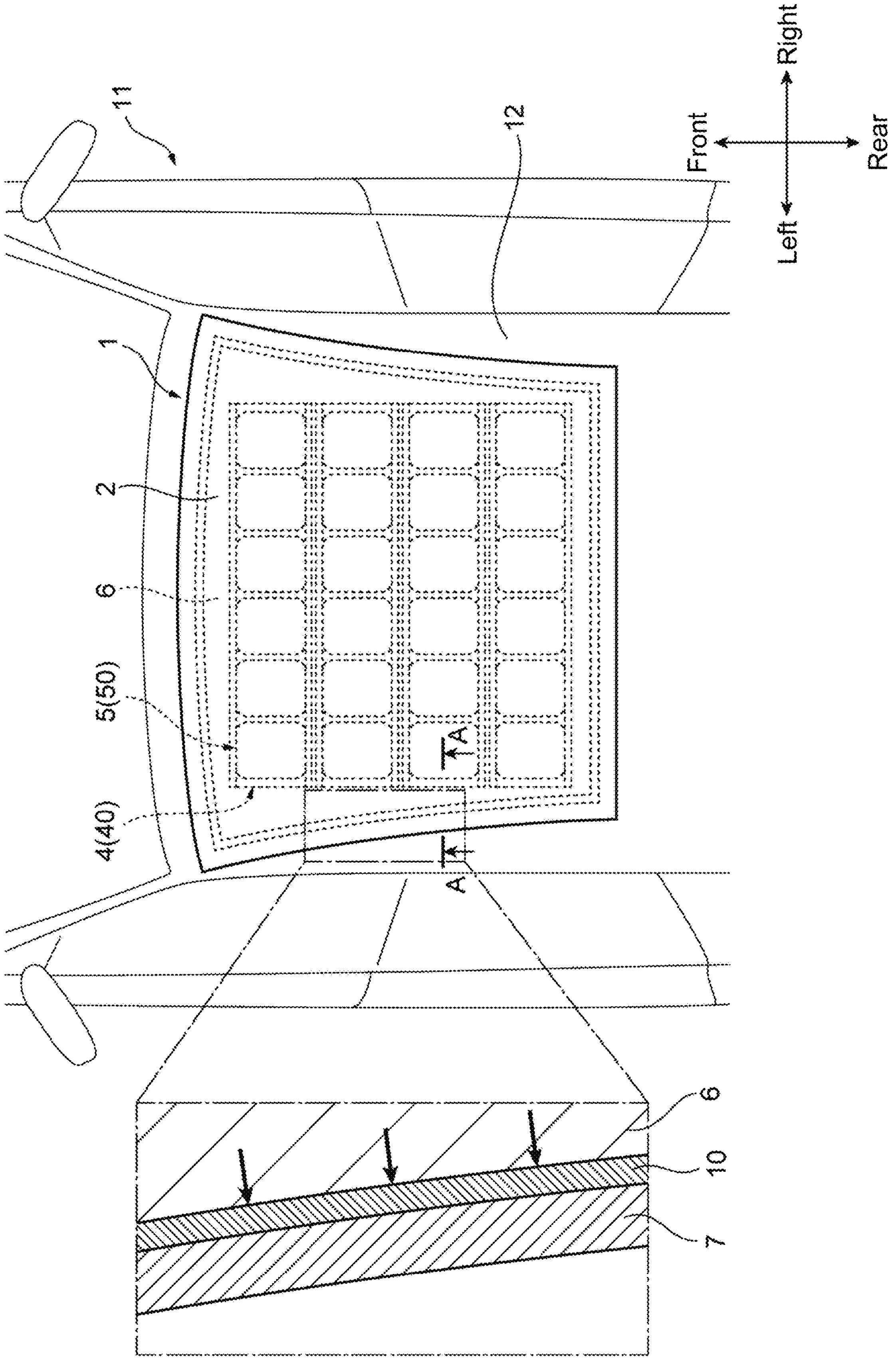
FIG. 1 is a plan view schematically showing a state of a solar cell module according to the present embodiment being mounted on a roof substrate already mounted on a vehicle, including an enlarged cross-sectional view schematically showing an edge portion of the solar cell module.

FIG. 1 is a plan view schematically showing a state of a solar cell module 1 according to the present embodiment being mounted on a roof substrate already mounted on a vehicle 11. The roof substrate having the solar cell module 1 according to the present embodiment mounted thereon forms a roof 12 of the vehicle 11. The solar cell module 1 has a curved plate shape, and thus can be mounted on the roof substrate in accordance with the shape of the roof substrate of the vehicle 11 similarly curved.

The solar cell module 1 is in a tandem structure and includes a translucent glass front surface plate 2 on an uppermost layer (that is, the layer on the very front as viewed in the orientation of FIG. 1) of the roof 12. When the solar cell module 1 is irradiated with light such as sunlight, the irradiated light permeates the front surface plate 2 and then reaches the inside of the solar cell module 1. In this manner, an electromotive force is generated between the positive electrode and the negative electrode of the solar cell module 1, so that the generated electric power can be supplied to the vehicle 11 or the like.

Note that the solar cell module 1 is thin and lightweight. Taking advantage of such properties, the solar cell module 1 can also be mounted on various objects such as a roof of a building other than the roof substrate of the vehicle 11 as illustrated in FIG. 1.

Figure 2:
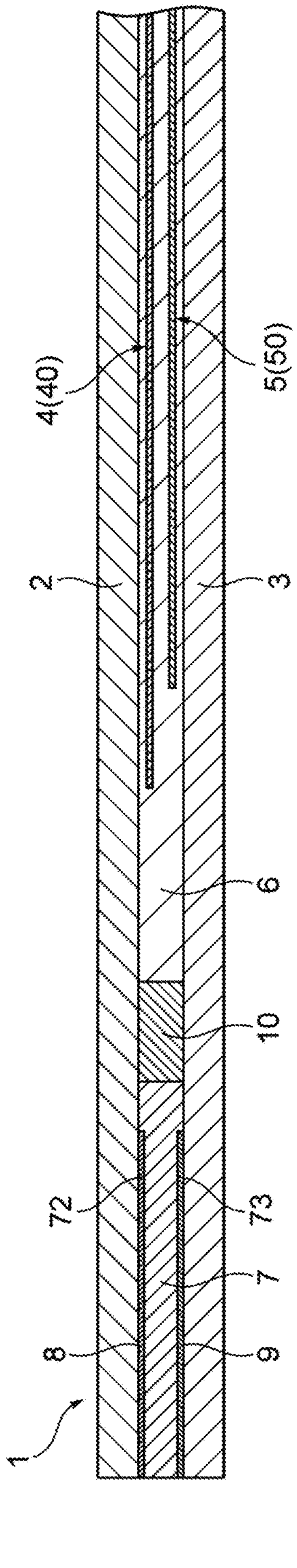
FIG. 2 is an enlarged cross-sectional view schematically showing the edge portion of the solar cell module according to the present embodiment (cross-sectional view schematically showing a cross-section cut along line A-A of FIG. 1)

FIG. 2 is an enlarged cross-sectional view schematically showing the edge portion of the solar cell module 1 according to the present embodiment, that is, a cross-sectional view schematically showing a cross-section cut along line A-A of FIG. 1. Note that the solar cell module 1 is for on-vehicle use and is curved in accordance with the shape of the roof substrate of the vehicle 11, but the cross-sectional view shows it in a flat plate shape, as a matter of convenience. The solar cell module 1 includes the front surface plate 2, a back surface plate 3, and between the front surface plate 2 and the back surface plate 3, first and second solar cell units (also referred to as solar cell arrays) 4 and 5, which are arranged in order from the front surface plate 2, a sealing material 6 that seals the first and second solar cell units 4 and 5, and the like. The back surface plate 3, as well as the front surface plate 2, is made of glass. In other words, in the solar cell module 1, the first solar cell unit 4 and the second solar cell unit 5 are vertically arranged (stacked) between the front surface plate 2 and the back surface plate 3 and are sealed and joined together by the sealing material 6.

The first solar cell unit 4 includes a plurality of substantially rectangular first solar cells 40 which is disposed in a matrix with a slight distance from one another in a plan view. In the present embodiment, the first solar cell unit 4 has a plurality of (e.g., four) first solar cells 40 in a strip shape (longer in the vehicle-width direction than in the vehicle-length direction), and the plurality of first solar cells 40 is arranged in parallel in the short-side direction (in the vehicle-length direction) (see also FIG. 1). Each first solar cell 40 includes a perovskite device, electrodes, and the like and is curved in accordance with the curved shape of the solar cell module 1. The perovskite device is a flexible power-generating device including perovskite as a raw material.

The second solar cell unit 5 includes a plurality of substantially rectangular silicon cells 50 as second solar cells which is disposed in a matrix with a slight distance from one another in a plan view so as to oppose the plurality of first solar cells 40 in the up-down direction. In the present embodiment, the second solar cell unit 5 has a plurality of (e.g., six) silicon cells 50 arranged along the longitudinal direction (vehicle-width direction) of the first solar cells 40 (6×4=24 in total) (see also FIG. 1). Each silicon cell 50 includes a silicon device, electrodes, and the like and is curved in accordance with the curved shape of the solar cell module 1. The silicon device is also one type of power-generating devices and may be either a single crystal or a polycrystal.

As described above, the irradiated light after permeating the front surface plate 2 reaches the inside of the solar cell module 1. The irradiated light, upon reaching the perovskite devices first, is either absorbed in the perovskite devices or penetrates the perovskite devices to be absorbed in the silicon devices depending on the wavelength band of the irradiated light. Specifically, light in a wavelength band shorter than a predetermined value, such as a visible ray, is absorbed in the perovskite devices, while light in a wavelength band longer than a predetermined value, such as an infrared ray, penetrates the perovskite devices to be absorbed in the silicon devices. That is, by stacking the power-generating devices absorbing light in different wavelengths, the light in a wide spectral range of wavelengths can be absorbed, so that the energy of the irradiated light can be highly efficiently converted into an electrical energy.

Note that the perovskite devices (first solar cells 40) and the silicon devices (silicon cells 50) are separately, electrically connected via interconnectors (not shown), and the electric current flows through the entire first and second solar cell units 4 and 5 via the interconnectors.

Note that the configuration of the solar cell unit, which is a power generating portion of the solar cell module 1, is not limited to the illustrated configuration. For example, in the present embodiment, a tandem structure in which the first and second solar cell units 4 and 5 are disposed vertically is illustrated, but a single solar cell unit (for example, a solar cell unit composed of a plurality of silicon cells) may constitute the power generating portion. Further, the solar cells constituting the solar cell unit are not particularly limited, and any conventionally known solar cells can be used.

The present embodiment is characterized by the structure of the edge portion of the solar cell module 1, in which a structure for preventing water ingress (securing the performance in terms of the water vapor transmission rate), as well as protrusion of the sealing material, is provided on the entire circumference of the edge portion of the solar cell module 1.

Specifically, between an edge portion (peripheral edge) of the front surface plate 2 disposed on the light-receiving surface side (light incident side) of the first and second solar cell units 4 and 5 and an edge portion (peripheral edge) of the back surface plate 3 disposed on the opposite side (non-light-receiving surface side) of the light-receiving surface side of the first and second solar cell units 4 and 5, a spacer 7, butyl rubber 8 and 9, and foam rubber 10, which are formed substantially in a frame shape (in other words, formed of a frame-shaped member), are interposed.

The spacer 7, the butyl rubber 8, and the butyl rubber 9 each have an encircling shape formed of rim portions arranged at four edge portions of the solar cell module 1 being connected to adjacent rim portions, and define a predetermined space therein. The outer shapes of the spacer 7, the butyl rubber 8, and the butyl rubber 9 are designed so as to be in substantially the same size as those of the front surface plate 2 and the back surface plate 3.

In the present embodiment, the spacer 7 has a substantially rectangular cross-section. The spacer 7 has a predetermined thickness in the thickness direction of the solar cell module 1 (first and second solar cell units 4 and 5), and is disposed between the edge portion (peripheral edge) of the front surface plate 2 and the edge portion (peripheral edge) of the solar cell 3 so as to surround the first and second solar cell units 4 and 5 (outer sides thereof) and serves to separate the front surface plate 2 and the back surface plate 3 in the thickness direction, thereby securing a space where the first and second solar cell units 4 and 5 are disposed in the thickness direction.

Further, the spacer 7 has a predetermined width in the width direction (direction orthogonal to the thickness direction) of the solar cell module 1 (first and second solar cell units 4 and 5), and has (annular) recesses 72 and 73, each having a step with a predetermined width in the width direction, formed at the edge portion (peripheral edge) of an upper surface facing the edge portion of the front surface plate 2 and at the edge portion (peripheral edge) of a lower surface facing the back surface plate 3.

As the material of the spacer 7, for example, a material having heat resistance enough to withstand the heat applied in a lamination process described later can be used, and for example, aluminum may be used, but the material is not limited thereto.

In the present embodiment, the butyl rubber 8 and the butyl rubber 9 each have a flat and substantially rectangular cross-sectional shape (that is, a thin and wide sheet shape), and are respectively accommodated (mounted) in the recess 72 provided on the upper surface of the spacer 7 and the recess 73 provided on the lower surface of the spacer 7 and are respectively interposed between the spacer 7 and the edge portion of the front surface plate 2 and between the spacer 7 and the edge portion of the back surface plate 3. The butyl rubber 8 has a predetermined thickness in the thickness direction of the solar cell module 1 (first and second solar cell units 4 and 5), and elastically adheres to the spacer 7 (upper surface thereof) and the edge portion (lower surface thereof) of the front surface plate 2 while minimizing the cross-sectional area (area as viewed in the width direction) of a water passage so as to serve to seal a gap (entire circumference thereof) between the spacer 7 and the edge portion of the front surface plate 2. Likewise, the butyl rubber 9 has a predetermined thickness in the thickness direction of the solar cell module 1 (first and second solar cell units 4 and 5), and elastically adheres to the spacer 7 (lower surface thereof) and the edge portion (upper surface thereof) of the back surface plate 3 while minimizing the cross-sectional area (area as viewed in the width direction) of a water passage so as to serve to seal a gap (entire circumference thereof) between the spacer 7 and the edge portion of the back surface plate 3.

Further, the butyl rubber 8 and the butyl rubber 9 each have a predetermined width in the width direction of the solar cell module 1 (first and second solar cell units 4 and 5), and secure a passage length (length in the width direction) of the water passage (sealing portion) between the spacer 7 and the edge portion of the front surface plate 2 and a passage length of the water passage between the spacer 7 and the edge portion of the back surface plate 3.

Note that in the present embodiment, butyl rubber is used as the sealing material disposed above and below the spacer 7, but for example, a member other than the butyl rubber may also be used as long as the member is made of a material having heat resistance enough to withstand the heat applied in the lamination process described later.

Further, in the aforementioned embodiment, at an outer edge portion (peripheral edge) of the spacer 7, the recesses 72 and 73 for accommodating the butyl rubber 8 and 9 are formed, but the recesses may be formed at an inner edge portion or a center of the spacer 7. Furthermore, the recesses may be formed at a plurality of sites (for example, both sides of the outer and inner edge portions) of the spacer 7 so as to accommodate therein the butyl rubber (divided) as a sealing material.

As with the spacer 7 or the like, the foam rubber 10 basically has an encircling shape to define a predetermined space therein. In the present embodiment, the foam rubber 10 has a substantially rectangular cross-sectional shape. The foam rubber 10 has substantially the same thickness as that of the spacer 7 in the thickness direction of the solar cell module 1 (first and second solar cell units 4 and 5) and is disposed between the front surface plate 2 and the back surface plate 3 so as to be interposed between the spacer 7 and the sealing material 6 (in other words, positioned adjacently to the inner side of the spacer 7) (see also FIG. 1).

Further, the foam rubber 10 has a predetermined width in the width direction of the solar cell module 1 (first and second solar cell units 4 and 5), and is interposed between the spacer 7 and the sealing material 6, and serves to elastically relax or absorb the pressing force of the sealing material 6 against the spacer 7 in the lamination process described later.

As the material of the foam rubber 10, for example, a material having heat resistance enough to withstand the heat applied in the lamination process described later can be used, and for example, silicone may be used, but the material is not limited thereto.

The space defined by the front surface plate 2, the back surface plate 3, and the foam rubber 10 disposed on the inner side of the spacer 7, which is an internal space of the solar cell module 1, is filled with the sealing material 6. That is, the sealing material 6 closely adheres to each of the front surface plate 2, the back surface plate 3, and the foam rubber 10 disposed on the inner side of the spacer 7 so as to seal the first and second solar cell units 4 and 5 therein. As the resin material constituting the sealing material 6, for example, resin material containing an ethylene-vinyl acetate copolymer (EVA) resin, a polyvinyl butyral (PVB) resin, a silicone resin, a polyolefin resin, an ionomer resin, and the like may be used.

Further, in the present embodiment, the aforementioned spacer 7, butyl rubber 8 and 9, and foam rubber 10 are disposed on an outer side of the module relative to a black ceramic coating of the front surface plate 2 on a daylighting side.

Next, a method for manufacturing the solar cell module 1 according to the present embodiment will be described. The manufacturing method includes a preparation process and a thermal compression process. Specifically, in the preparation process, the first solar cell unit 4 as a power-generating circuit is prepared in advance by electrically connecting the plurality of first solar cells 40 to one another by means of interconnectors. Similarly, the second solar cell unit 5 as a power-generating circuit is prepared in advance by electrically connecting the plurality of silicon cells 50 to one another by means of interconnectors. Further, the spacer 7 with the butyl rubber 8 and 9 mounted in the recesses 72 and 73 and with the foam rubber 10 mounted inside is prepared in advance. Then, between the curved translucent front surface plate 2 and the curved back surface plate 3 and on the inner side of the foam rubber 10 disposed on the inner side of the spacer 7 with the butyl rubber 8 and 9, a stacked body is prepared (also referred to as laid up) in which the first and second solar cell units 4 and 5 are disposed in order from the front surface plate 2 side so as to sandwich the resin sealing material sheet (also referred to as a lamination sheet). At this time, connecting ends of the interconnectors of the first and second solar cell units 4 and 5 are inserted into, for example, through-holes provided in the back surface plate 3 and are withdrawn to the inner side of the vehicle.

The perovskite device significantly deteriorates due to water ingress as compared to conventional silicon cells, thus requiring a countermeasure. As such a countermeasure, a structure using butyl rubber as the sealing material on the outer circumference of the solar cell module 1 is promising and a method of minimizing the cross-sectional area of the opening of the sealing portion (area as viewed in the width direction) is effective. In some examples of the present embodiment having the stacked layer structure, the total thickness excluding those of the front surface plate 2 and the back surface plate 3 is 2.4 mm when the thicknesses of the sealing material sheet, the first solar cell unit, the sealing material sheet, the second solar cell unit, and the sealing material sheet in order from the front surface plate 2 side as the daylighting side are set to 0.5 mm, 0.2 mm, 1.0 mm, 0.2 mm, and 0.5 mm, respectively. In this case, the thickness 2.4 mm of the stepped spacer 7 may be a designed dimension, and the depth dimension (dimension in the thickness direction) of the recesses 72 and 73 formed of steps may be 0.1 mm for one side. The structure may be made such that the recesses 72 and 73 having a depth of 0.1 mm are filled with the butyl rubber 8 and 9 (with a thickness of 0.1 mm or slightly greater). The sealing width of the butyl rubber 8 and 9 becomes the length of the passage, and may be, but not limited to, 10 to 20 mm.

The thermal compression process (lamination process) thermally compresses the stacked body prepared in the preparation process, at a heating temperature equal to or higher than the softening point of resin until the first and second solar cell units 4 and 5 are sealed with the resin of the sealing material sheet, using a vacuum lamination device (hereinafter also referred to as a laminator). Specifically, the stacked body is placed on a laminating jig, and the laminating jig is placed on a heater plate of the laminator and is sealed within a chamber, and is then sufficiently degassed to prevent mixture of air or the like. After sufficiently degassing, the resin of the sealing material sheet is heated at a heating temperature equal to or higher than the softening point of the resin to be softened, using a heater built in the heater plate. At this time, with the inside of the laminator opened to the atmosphere, the stacked body is pressed by a diaphragm at an atmospheric pressure (for example, 100 kPa) from above. Thereafter, the softened resin of the sealing material sheet is crosslinked and adhesively bonded so as to form the sealing material 6 in a space that is defined by the front surface plate 2, the back surface plate 3, and the foam rubber 10 disposed on the inner side of the spacer 7, and the first and second solar cell units 4 and 5 are sealed with the sealing material 6, thus ending the thermal compression process. In this thermal compression process, when the quantity of the sealing material 6 is large, the foam rubber 10 is elastically deformed (the volume is compressed), so that the force of the crosslinked and cured sealing material 6 pushing the spacer 7 (and the butyl rubber 8 and 9) outward can be elastically relaxed or absorbed, thereby enabling to absorb the variations in volume of the sealing material 6.

Figure 3:
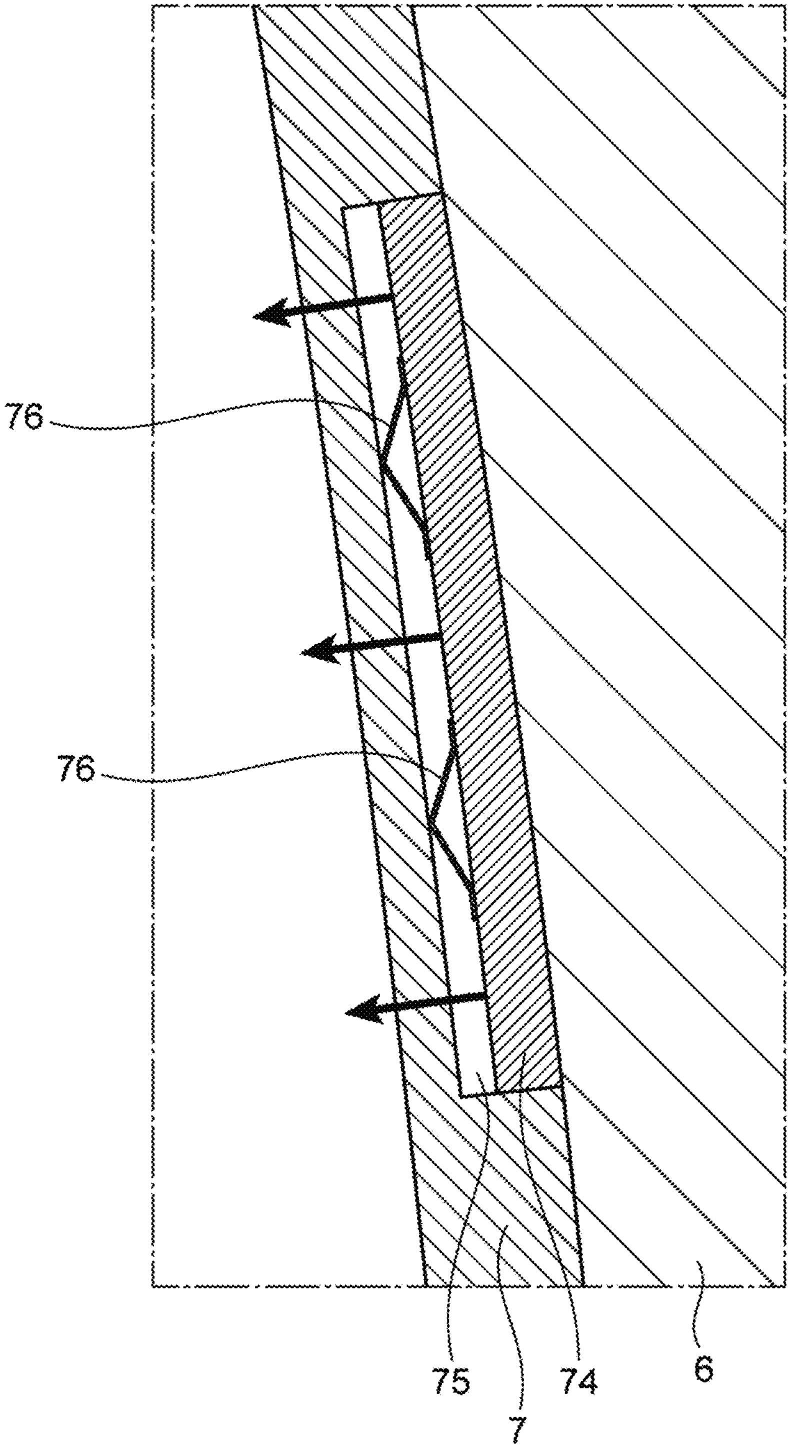
FIG. 3 is an enlarged cross-sectional view schematically showing the edge portion of the solar cell module according to a first modification.

Note that in the aforementioned embodiment, the foam rubber 10 is disposed on the inner side of the spacer 7 in order to relax or absorb the pressing force of the sealing material 6 against the spacer 7 (and the butyl rubber 8 and 9), but for example, the structure may also be made such that a movable spacer portion is provided on the inner side of the spacer 7 (in place of the foam rubber 10). Specifically, as shown in FIG. 3, in a site where the foam rubber 10 is not provided between the spacer 7 and the sealing material 6, on the inner side of the spacer 7, a movable spacer portion 74 contacting the sealing material 6 may be formed and a space 75 where the movable spacer portion 74 can move may also be formed on the outer side of the movable spacer portion 74 (opposite side of the sealing material 6). Further, the space 75 may be provided with a biasing member 76 that biases the movable spacer portion 74 inward (toward the sealing material 6). As the biasing member 76, foam rubber (a member different from the foam rubber 10), a spring, and the like may be used. In the aforementioned thermal compression process, when the quantity of the sealing material 6 is large, the movable spacer portion 74 moves to the outer side within the space 75 (against the biasing force of the biasing member 76), so that the force of the crosslinked and cured sealing material 6 pushing the spacer 7 (and the butyl rubber 8 and 9) outward can be relaxed or absorbed.

Figure 4:
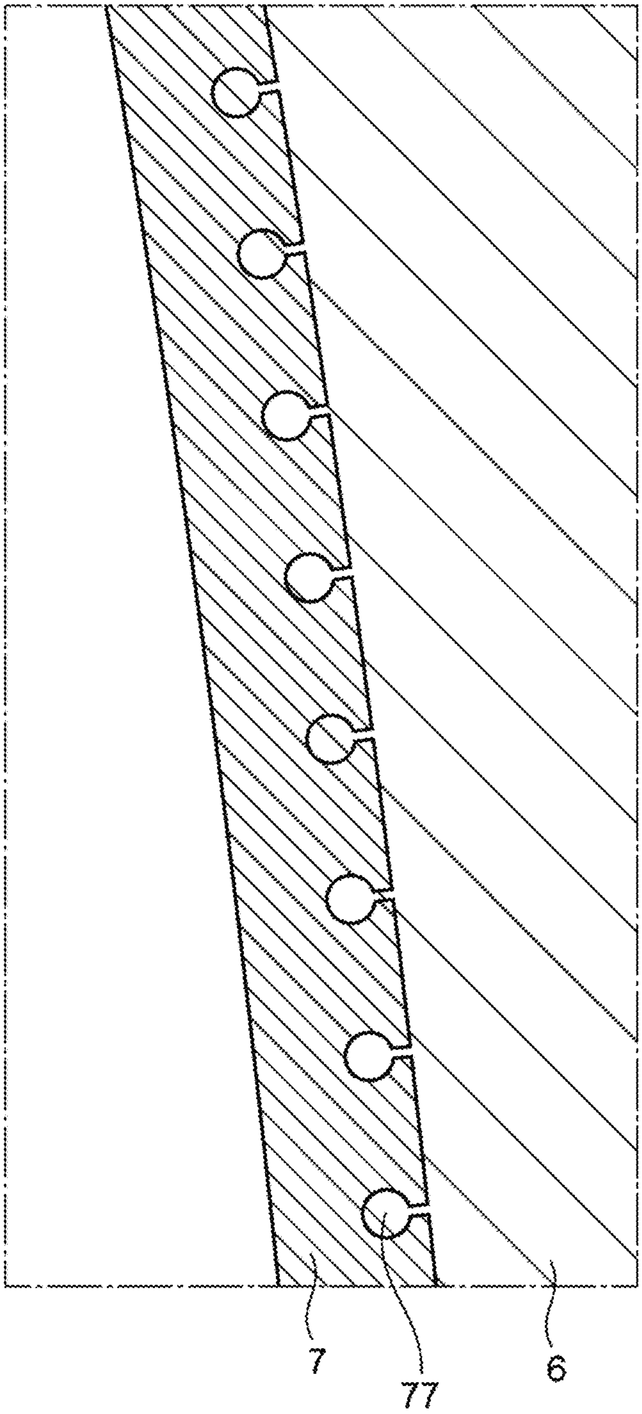
FIG. 4 is an enlarged cross-sectional view schematically showing the edge portion of the solar cell module according to a second modification.

Further, for example, the structure may be made such that on the inner side of the spacer 7, a space 77 having an inlet on the inner side (sealing material 6 side) is provided. Specifically, as shown in FIG. 4, in a site where the foam rubber 10 is not provided between the spacer 7 and the sealing material 6, on the inner side of the spacer 7 (portion contacting the sealing material 6), the space 77 may be formed that opens to the inner side (sealing material 6 side) of the spacer 7 and where a portion (excess portion) of the sealing material 6 can enter. The space 77 may be in any shape, volume, number, arrangement position, and the like. In the aforementioned thermal compression process, when the quantity of the sealing material 6 is large, a portion (excess portion) of the sealing material 6 enters the space 77, so that the force of the crosslinked and cured sealing material 6 pushing the spacer 7 (and the butyl rubber 8 and 9) outward can be relaxed or absorbed.

To summarize the above, the solar cell module 1 according to the present embodiment has the structure in which the stepped spacer 7 and the butyl rubber 8 and 9 are disposed in the entire circumference of the edge portion of the solar cell module 1, and the butyl rubber 8 and 9 are filled in the recesses 72 and 73 formed of steps of the spacer 7.

Further, on the inner side of the stepped spacer 7, the foam rubber 10 is provided (FIGS. 1 and 2).

Furthermore, on the inner side of the stepped spacer 7, the movable spacer portion 74 is provided (FIG. 3).

In addition, the space 77 having the inlet provided on the inner side of the stepped spacer 7 is provided inside the spacer 7 (FIG. 4).

Further, the stepped spacer 7, the foam rubber 10, and the like are disposed on the outer side of the module relative to the black ceramic coating of the front surface plate 2 on the daylighting side.

With the stepped spacer 7, the sealing heights of the vertically arranged butyl rubber 8 and 9 are strictly controlled.

Thus, when a passage of external water entering the solar cell module 1 is considered, the cross-sectional area of the water passage is obtained by multiplying the sealing height (A) of the butyl rubber 8 and 9 by the outer circumferential length (B) of the solar cell module 1 (A×B). The passage length is the sealing width (C) of the butyl rubber 8 and 9. Therefore, as a countermeasure against water ingress in the solar cell module 1, it is effective to minimize the cross-sectional area (A×B) and increase the passage length (C) in a geometric approach. Increasing the passage length (C) contrarily decreases the cell area, which is a promising approach for minimizing the cross-sectional area (A×B).

In manufacturing the solar cell module 1, a vacuum lamination device (laminator) is used. The sealing material sheets are prepared in a predetermined number, but vary in thickness in manufacturing, and therefore, the lay-up operation cannot be well controlled in a mass-production process. The sealing material in large quantity has a problem of pushing the stepped spacer 7 and the butyl rubber 8 and 9 outward. On the other hand, the sealing material in small quantity has a problem of generating bubbles around the cells. Thus, to achieve the aforementioned structure of the sealing portion, the volume of the sealing material 6 needs to be strictly controlled. In the present embodiment, although in order to suppress generation of bubbles, the sealing material 6 to be filled has a volume larger than the volume of the solar cell module based on the expectation that the thickness of the sealing material sheet is the smallest in variations in manufacturing, since a protruding portion (excess portion) of the sealing material 6 is treated by means of the foam rubber 10, the movable spacer portion 74, and the space 77 in the spacer 7, it is possible to prevent the protruding portion (excess portion) of the sealing material 6 from pushing the stepped spacer 7 and the butyl rubber 8 and 9 to the outside of the solar cell module 1, thereby enabling to prepare the solar cell module 1 as desired.

As another point, the buffer space of the sealing material 6 is provided immediately on the inner side of the spacer 7 and is crimped in the pressing process during lamination, but at this time, the excess portion of the sealing material 6 is treated inside the stepped spacer 7, thereby generating no bubbles in the portion where the cells are arranged.

Further, the black ceramic coating is applied to the inner side of the front surface plate 2 on the daylighting side, which makes the stepped spacer 7, the foam rubber 10, the movable spacer portion 74, and the space 77 in the spacer 7 invisible from outside, thereby enabling to improve the appearance quality.

As described above, the solar cell module 1 according to the present embodiment includes: the solar cell unit (first and second solar cell units 4 and 5) including at least one solar cell; the solar cell sealing material (sealing material 6) that seals the solar cell unit; the (translucent) front surface plate 2 disposed on the light-receiving surface side of the solar cell unit in the solar cell sealing material; the back surface plate 3 disposed on the opposite side (non-light-receiving surface side) of the light-receiving surface side in the solar cell sealing material; the spacer 7 disposed between the edge portion (peripheral edge) of the front surface plate 2 and the edge portion (peripheral edge) of the back surface plate 3 (in the circumference (outer side) of the solar cell unit) so as to surround the solar cell unit (outer side thereof) sealed with the solar cell sealing material, the spacer 7 securing the space where the solar cell unit is disposed in the thickness direction of the solar cell unit; the front surface plate side sealing material (butyl rubber 8) that seals a gap (entire circumference thereof) between the edge portion of the front surface plate 2 and the spacer 7 and the back surface plate side sealing material (butyl rubber 9) that seals a gap (entire circumference thereof) between the edge portion of the back surface plate 3 and the spacer 7; and the foam rubber 10 disposed between the front surface plate 2 and the back surface plate 3 so as to be interposed (positioned on the inner side of the spacer 7) between the spacer 7 and the solar cell sealing material, the foam rubber 10 being capable of (elastically) relaxing or absorbing the pressing force of the solar cell sealing material against the spacer 7.

The front surface plate side sealing material (butyl rubber 8) is mounted in the (annular) recess 72 provided on the upper surface of the spacer 7, the upper surface facing the edge portion of the front surface plate 2, and the back surface plate side sealing material (butyl rubber 9) is mounted in the (annular) recess 73 provided on the lower surface of the spacer 7, the lower surface facing the edge portion of the back surface plate 3.

In a site where the foam rubber 10 is not provided between the spacer 7 and the solar cell sealing material (sealing material 6), the spacer 7 includes the movable spacer portion 74 contacting the solar cell sealing material and the space 75 that is provided on the opposite side (outer side) of a side of the solar cell sealing material in the movable spacer portion 74 and where the movable spacer portion 74 can move.

The space 75 is provided with the biasing member 76 that biases the movable spacer portion 74 toward the side (inside) of the solar cell sealing material.

In a site where the foam rubber 10 is not provided between the spacer 7 and the solar cell sealing material (sealing material 6), the spacer 7 includes, in a portion (inner side) contacting the solar cell sealing material, the space 77 that opens to the side of the solar cell sealing material and where a portion (excess portion) of the solar cell sealing material can enter.

According to the present embodiment, for example, with the spacer 7 having the recesses 72 and 73 for accommodating the sealing material (butyl rubber 8 and 9), the position and thickness of the sealing material (butyl rubber 8 and 9) can be strictly controlled, and with the foam rubber 10 provided on the inner side of the spacer 7, the excess sealing material 6 can be absorbed so as to control the thickness of the sealing material 6, thereby enabling to secure the performance in terms of the rate of water vapor transmission through the module edge portion.

Note that the present disclosure is not limited to the aforementioned embodiment, and modifications and changes can be appropriately made within the scope without departing from the object of the present disclosure.

DESCRIPTION OF SYMBOLS

1 Solar cell module
2 Front surface plate
3 Back surface plate
4 First solar cell unit
40 First solar cell (perovskite device)
5 Second solar cell unit
50 Silicon cell (second solar cell, silicon device)
6 Sealing material (solar cell sealing material)
7 Spacer
72 Recess (upper surface)
73 Recess (lower surface)
74 Movable spacer portion
75 Space
76 Biasing member
77 Space
8 Butyl rubber (front surface plate side sealing material)
9 Butyl rubber (back surface plate side sealing material)
10 Foam rubber
11 Vehicle
12 Roof

What is claimed is:

1. A solar cell module comprising:

a solar cell unit including at least one solar cell;

a solar cell sealing material that seals the solar cell unit;

a front surface plate disposed on a light-receiving surface side of the solar cell unit in the solar cell sealing material;

a back surface plate disposed on an opposite side of the light-receiving surface side in the solar cell sealing material;

a spacer disposed between an edge portion of the front surface plate and an edge portion of the back surface plate so as to surround the solar cell unit sealed with the solar cell sealing material, the spacer securing a space where the solar cell unit is disposed in a thickness direction of the solar cell unit;

a front surface plate side sealing material that seals a gap between the edge portion of the front surface plate and the spacer and a back surface plate side sealing material that seals a gap between the edge portion of the back surface plate and the spacer; and foam rubber disposed between the front surface plate and the back surface plate so as to be interposed between the spacer and the solar cell sealing material, the foam rubber being capable of relaxing or absorbing a pressing force of the solar cell sealing material against the spacer.

2. The solar cell module according to claim 1, wherein the front surface plate side sealing material is mounted in a recess provided on an upper surface of the spacer, the upper surface facing the edge portion of the front surface plate, and the back surface plate side sealing material is mounted in a recess provided on a lower surface of the spacer, the lower surface facing the edge portion of the back surface plate.

3. The solar cell module according to claim 1, wherein in a site where the foam rubber is not provided between the spacer and the solar cell sealing material, the spacer includes a movable spacer portion contacting the solar cell sealing material and a space that is provided on an opposite side of a side of the solar cell sealing material in the movable spacer portion and where the movable spacer portion can move.

4. The solar cell module according to claim 3, wherein the space is provided with a biasing member that biases the movable spacer portion toward the side of the solar cell sealing material.

5. The solar cell module according to claim 1, wherein in a site where the foam rubber is not provided between the spacer and the solar cell sealing material, the spacer includes, in a portion contacting the solar cell sealing material, a space that opens to a side of the solar cell sealing material and where a portion of the solar cell sealing material can enter.

* * * * *